United States Patent [19]
Rudman et al.

[11] Patent Number: 5,479,015
[45] Date of Patent: Dec. 26, 1995

[54] MULTI-IMAGE DETECTOR ASSEMBLY

[75] Inventors: Stanley Rudman, Nessonset, N.Y.; John Cox, Vienna, Va.; Richard Oman, Huntington; Robert E. Ryan, Levitton, both of N.Y.

[73] Assignee: Grumman Aerospace Corporation, Bethpage, N.Y.

[21] Appl. No.: 292,381

[22] Filed: Aug. 18, 1994

[51] Int. Cl.⁶ .......................... H01L 31/0232; G01J 5/08
[52] U.S. Cl. ................ 250/332; 250/208.1; 250/370.08
[58] Field of Search ............................. 250/332, 370.08, 250/208.1

[56] References Cited

U.S. PATENT DOCUMENTS

| 4,362,938 | 12/1982 | Bosserman | 250/332 |
|---|---|---|---|
| 4,403,238 | 9/1983 | Clark. | |
| 4,551,629 | 11/1985 | Carson et al. | 250/578 |
| 4,646,128 | 2/1987 | Carson et al. | |
| 4,706,166 | 11/1987 | Go | 361/403 |
| 4,764,846 | 8/1988 | Go | 361/388 |
| 4,806,761 | 2/1989 | Carson et al. | 250/332 |
| 4,814,629 | 3/1989 | Arnold | 250/578 |
| 4,996,427 | 2/1991 | Noble et al. | 250/332 |
| 5,109,158 | 4/1992 | Horne | 250/332 |
| 5,149,970 | 9/1992 | Whitney | 250/332 X |
| 5,258,618 | 11/1993 | Noble | 250/332 |
| 5,416,324 | 5/1995 | Chun | 250/332 X |

*Primary Examiner*—Carolyn E. Fields
*Assistant Examiner*—Edward J. Glick
*Attorney, Agent, or Firm*—Stetina Brunda & Buyan

[57] ABSTRACT

A multi-image detector assembly has an array of detector elements formed upon a single focal plane and a plurality of focusing members, each focusing member focusing a substantially identical scene upon a corresponding one of a plurality of sections of the array. An optical element such as a spectral or polarizing filter is disposed within a plurality of the optical paths of the focusing members, preferably proximate the focal plane. Image detection occurs continuously and simultaneously so as to provide a spatially and temporally correlated set of separate images utilizing the single focal plane.

19 Claims, 1 Drawing Sheet

MULTI-IMAGE DETECTOR ASSEMBLY

FIELD OF THE INVENTION

The present invention relates generally to imaging optical systems and more particularly to a low cost, light weight, multi-image detector assembly for imaging an identical scene upon a plurality of separate sections of a detector array, wherein a different filter, polarizer, or other optical element is associated with each focusing member such that a correlated set of images of the scene is provided from a single focal plane.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects will dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change the infrared radiation is measured.

Photo-type detectors (e.g., photoconductive and photovoltaic detectors) absorb the infrared frequency energy directly into the electronic structure of the material, inducing an electronic transition which, in turn, leads to either a change in the electrical conductivity (photoconductors) or to the generation of an output voltage across the terminals of the detector (photovoltaic detectors). The precise change that is effected is a function of various factors including the particular detector material selected, the doping density of that material and the detector area.

By the late 1800's, infrared detectors had been developed that could detect the heat from an animal at one quarter of a mile. The introduction of a focusing lenses constructed of materials transparent to infrared frequency energy, as well as advances in semiconductor materials and highly sensitive electronic circuity have advanced the performance of contemporary infrared detectors close to the ideal photon limit.

Current infrared detection systems incorporate arrays of large numbers of discrete, highly sensitive detector elements the outputs of which are connected to sophisticated processing circuity. By rapidly analyzing the pattern and sequence of detector element excitations, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total of 65,536 detectors, the size of each square detector being approximately 0.0035 inches on a side with 0.0005 inches spacing between detectors. The total width of such a subarray would therefore be 1.024 inches on a side. Thus, interconnection of such a subarray to processing circuitry requires a connective module with sufficient circuitry to connect each of the 65,536 detectors to processing circuitry within a square a little more than one inch on a side. The subarrays may, in turn, be joined to form an array that includes 25 million detectors or more.

In such contemporary infrared detection systems, a viewed target or scene forms a single image upon the focal plane. When it is desired to sense different portions of the infrared spectrum, movable filters are interposed, generally intermediate the focusing lens and the infrared detector array. However, such assemblies are inherently expensive, heavy, large and fragile.

The use of such mechanisms to effect movement of the filters undesirably adds costs and weight to the infrared detection system. More significantly though, such mechanisms are mechanically complex and require a high degree of precision to obtain the desired results. Thus, the reliability of moveable filters is of particular concern. This is especially true in space-based applications wherein it is extremely difficult, if not impossible, to effect repair of such systems. Mechanical movement of the filters also introduces an observation dead time associated with: generation of control signals to initiate the fitter charge; settle-down times that depend on the inertial characteristics of the mechanical components; and slow speeds that may be necessary to preserve optical alignment, avoid setting up vibration, and preventing damage to fragile optics. In some military systems, any time loss associated with filter switching may be highly undesirable or even unacceptable.

Moreover, moveable filters, i.e., filter wheel devices, provide spectral data which is sequential in nature. It is much more desirable to provide all spectral data simultaneously. This is particularly important when viewing rapidly changing images.

As such, it would be beneficial to provide a low cost, light weight, low volume and reliable multi-image detector assembly which does not require the use of moveable filters or other optical components in order to sense different portions of the infrared spectrum or otherwise modify the incoming source signal.

SUMMARY OF THE MULTI-STAGE INVENTION

The present invention specifically addresses and alleviates the above mentioned deficiencies associated with the prior art. More particularly, the present invention comprises a detector assembly comprising an array of detector elements; a plurality of focusing members, each focusing member focusing a substantially identical scene upon a corresponding one of a plurality of sections of the array of detector elements, each focusing member and its corresponding array section defining an optical path; and an optical element disposed within a plurality of the optical paths. The optical element may be disposed upon either side of the focusing member. Each optical element has the purpose of defining wavelength regions that are transmitted, restricting or defining polarizations that are transmitted, and/or regulating transmitted intensity. Image detection occurs continuously and simultaneously so as to provide a correlated set of separate images utilizing a single focal plane. The focusing members comprise either diffraction gratings, lenses, or reflectors. The lenses or reflectors are preferably formed upon a single sheet of material. The material is transparent for lenses formed thereupon. Thus, lenses may comprise either diffractive or refractive lenses.

In a traditional single focal plane device served by moving filters, the data acquisition is necessarily sequential. The present invention provides the significant time advantages possible from essentially parallel data acquisition.

As used herein, the term optical element is defined to encompass any device which modifies an electromagnetic or optical signal. The term includes, but is not limited to, spectral and polarizing filters.

As used herein, the term correlated is defined to mean signals or images which are simultaneously received from a common source, target, or scene which differ from one another in the spectral filtering, polarization filtering, or other signal or optical processing.

As discussed in further detail below, the separate lens elements are preferably formed within a single common sheet of transparent material so as to maintain a precisely desired spatial relationship and alignment with respect to the overall focal plane array. Alternatively, the focusing members are formed upon separate elements of transparent material wherein each separate element of transparent material maintains a desired spatial relationship and alignment with respect to the focal plane array. The lenses or reflectors may optionally form the initial aperture of the multi-image detector array of the present invention. Alternatively, the light gathering ability of a larger lens and/or reflector may be utilized as the initial aperture to improve the light gathering capability of the device and increase the resolution and intensity of the plurality of images formed upon the focal plane. The optical elements are preferably formed proximate the array of detector elements so as to facilitate alignment thereof. The optical elements comprise members for modifying the optical characteristics of the signal transmitted along a particular optical path. Such optical elements typically comprise spectral filters and polarizing filters. Those skilled in the art will recognize that various other optical elements may additionally be utilized, either alone or in combination with such spectral filters and/or polarizing filters.

Thus, according to the methodology of the present invention, a plurality of copies of a scene are focused simultaneously upon a plurality of sections of a common array of detector elements. Each copy of the scene is optically modified, e.g., via spectral and/or polarizing filters, prior to its being focused upon selected detector elements. Each copy of the scene is either diffractively focused, refractively focused, or reflectively focused simultaneously upon the corresponding portion of the detector array. Thus, various different characteristics of the source signal may be simultaneously detected, measured, and analyzed so as to optimize the multi-image detector assembly's ability to accurately and reliably identify such source signals.

The pixels that comprise the element of the focal plane illuminated by a particular copy of the viewed scene are read out to the processing electronics as a subscene array. Each subscene array is recorded and/or processed as a scene viewed in a particular wavelength and/or polarization. Processing methods, usually referred to as algorithms, can take advantage of the differences in the images when different waveband intensities and different polarization states can be attributable to a specific region (designated polarization) in the overall scene. There are many ways to do this and thereby increase the detectability of targets and also to increase the knowledge about their operational state by contrasting temperatures, enhancing differences in surface reflectance or emissive properties, rejecting solar background, and similar well-established techniques. By creating a plurality of subscene images, each at different spectral bands and/or polarization states, yet closely registered to the same spatial regions pixel by pixel, the present invention permits a wide range of such algorithms to be created and employed as appropriate to each application.

Although described in the context of an infrared detector assembly, those skilled in the art will recognize that the multi-image detector assembly of the present invention is likewise suitable for use with various different spectral bands, e.g. ultraviolet, visible, infrared, etc. As such, the description and illustration of the present invention as an infrared multi-image detector assembly is by way of example only and not by way of limitation.

The present invention thus provides a low-cost, mass-producible sensor for use in a wide variety of different applications, e.g., infrared detection systems. It employs a novel configuration of contemporary lens and focal plane technologies to provide a low cost, light weight, low volume and reliable multi-image detector assembly which does not require the use of moveable filters or other optical components in order to sense different portions of the infrared spectrum or otherwise modify the incoming source signal. Thus, the sensor assembly obtains the advantages of multi-spectral and/or multi-polar staring detection and processing without the cost, weight, volume, and fragility disadvantages commonly associated with the moving components utilized in contemporary multi-spectral/multi-polar imaging sensors. Significant increases in data acquisition efficiency are also possible, since time bottlenecks associated with mechanical components have been eliminated by this device. This invention is capable of acquiring data in an essentially parallel fashion, rather than the inherently less efficient non-coaligned sequential method associated with filter wheels.

The multi-image detector assembly of the present invention comprises an array, typically rectangular, of substantially identical lenses, each of which projects an identical scene onto a separate section of a focal plane detector array. When different spectral filters and/or polarizers are utilized with each individual lens, a correlated set of images of the scene is generated by the common focal plane array.

An array of lenses is fixed into position, by various means as described in detail below, so as to focus an identical desired scene continuously upon dedicated portions of a common focal plane array. For example, utilizing a 644×488 focal plane detector array, a set of lenses might be arranged in 4×4 array to form 16 separate images upon the focal plane, each separate image containing 161×122 pixels. Each lens, being provided with a separate spectral and/or polarizing filter, thus provides a separate image. That is, 16 different wave bands and/or polarizations, covering the same scene, are formed upon individual portions of the focal plane array.

Lens arrays of 2×2, 3×2, 5×6, or any other combination could thus be utilized to give the desired number and type of wave bands for particular applications including, spectrometry, target detection, target identification, or battlefield damage assessment, for example. As those skilled in the art will recognize, larger pixel counts in the focal plane array provide better spatial resolution for given spectral resolution levels.

The preferred method for forming a lens array is to form diffractive lenses upon a single sheet or slab of transparent material, preferably via photolithography. Those skilled in the art will recognize various other means for forming diffractive lenses are likewise suitable. Such process preserves the spatial relationships and alignments among the separate images to a high degree of precision. As those skilled in the art will appreciate, the manufacturing and replication process for such lenses preferably includes adjustments from one lens to another for spectral region differences and diffractive and transmission properties. The diffraction characteristics of each lens is adjusted to place the image upon the proper part of the focal plane, thus compensating for differences in size between the lens array and the focal plane array.

As an alternative method for creating a lens array, refractive lenses are formed upon a single sheet of transparent material, thereby again preserving the spatial relationships and alignments along with separate images to a high degree of precision. Any established technique for forming the lenses, such as diamond turning, may be utilized, and analogous to the above discussed method the manufacturing or replication process may include adjustments from one lens to another for spectral region differences and refractive and transmissive properties. Again, the refractive characteristics of each lens is adjusted to place the image on the proper part of the common focal plane, thus compensating for differences in size between the lens array and the focal plane array.

As a further alternative, refractive and/or diffractive lenses are formed upon separate elements of transparent material, and each lens is mounted so as to preserve the spatial relationships and alignments among the separate images to a high degree of precision. As those skilled in the art will recognize, many established techniques for forming the lenses could be used, and the manufacturing or replication processes could include adjustments from one lens to the next for spectral region differences and refractive/diffractive and transmissive properties. Again, the mechanical alignment of each lens is adjusted to place its image on the proper part of the common focal plane, thus compensating for differences in size between the lens array and the focal plane array.

As yet a further alternative for creating the equivalent of a lens array, an array of reflective regions is formed upon a common mirror or a common mirror support structure, each reflective region shaped to focus the scene upon a corresponding portion of the focal plane array. Each reflective element is then mounted so as to preserve the spatial relationships and alignment among the separate images to a high degree of precision. As those skilled in the art will recognize, various established techniques for forming the reflective regions is suitable. Again, the mechanical alignment of each element is adjusted so as to place the image on the proper part of the common focal plane, thus compensating for differences in size between the reflector array and the focal plane array.

The lens or reflector arrays discussed above may form the initial aperture in many sensing applications. However, in other applications, the requirements for light-gathering power or spatial resolution may require a significantly larger aperture than could be achieved utilizing the lens or reflector arrays themselves. In such cases, a primary and secondary mirror or lens system can be introduced so as to condense the entire field, thus providing a smaller beam of parallel light conveying the scene as a whole to the spectral/polarizing array.

An array of optical filters, such as multi-layer dielectric stacks, is formed for each desired application or type of sensor. The filters are preferably formed as individual coatings upon the lenses or reflective elements. Alternatively, the filters may form separate optical elements interposed at any appropriate place along the optical path of each lens and focal plane section. The preferred configuration is to construct a filter array to be placed immediately in front of the focal plane array, thus providing the advantages of a cooled filter in cryogenic applications and also facilitating mechanical alignment and improving reliability.

Polarizing filters may be utilized along with or instead of spectral filters so as to provide comparative measurements for various different polarization axes. Thus, in a 4×4 lens array, for example, one may utilize four color or spectral filters, each provided with horizontal, vertical, circular, and unpolarized configurations.

Thus, the multi-image detector assembly of the present invention provides a low cost, practical system for determining time continuous spectral and/or polarization variations while achieving a moderate resolution spatial image. In many situations, it is known that the spectral and/or polarization differences in the emissive and reflective energy distributions provided by various elements of a scene are indicative of different target types. When it is important to discover and analyze particular elements of a scene, such differences provide important complements to the spatial and temporal differences and intensity commonly associated with the scene. Specific examples are commonly seen in the solar spectrum, which has a known spectral dependence, being reflected from surfaces at different orientations to give various polarizations. This information is superimposed upon the thermal emission, the intensity of which varies with the unknown surface temperature, as well as the known wavelength, in a way which is predictable from the laws of thermal emission. Advanced processing techniques that exploit various physical laws, along with a multiplicity of accurate data on the same location at the same time, can be brought to bear upon detection problems utilizing the multi-image detector system of the present invention.

Because of the mass production potential and compact size of the multi-image detector assembly of the present invention, it may also be used in disposable devices such as bombs, missiles and artillery shells, as well as in space-based (earth resource or environmental sensing; treaty verification; military intelligence) applications. Additionally, the present invention may be utilized by individual troops for various different detection purposes. The present invention is suitable for use in infrared, visible, and ultraviolet optical systems.

These, as well as other advantages of the present invention will be more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed description set forth below in connection with the appended drawings is intended as a description of the presently preferred embodiments of the invention, and is not intended to represent the only forms in which the present invention may be constructed or utilized. The description sets forth the functions and sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

Figure 1:
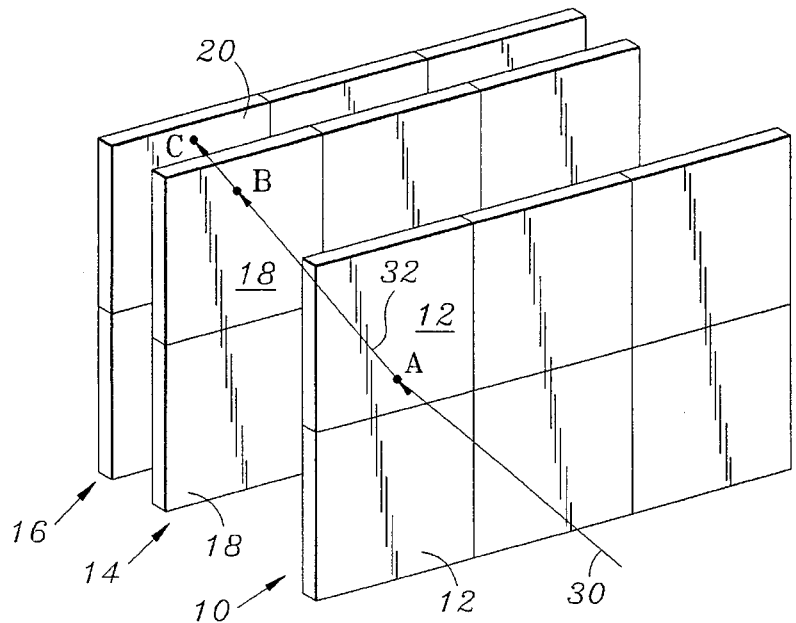
FIG. 1 is a perspective view of a first embodiment of the present invention wherein an array of lenses, i.e., either diffracting lenses or refracting lenses, focus light through optical elements, e.g., spectral or polarizing filters, upon dedicated sections of a focal plane array.
Figure 2:
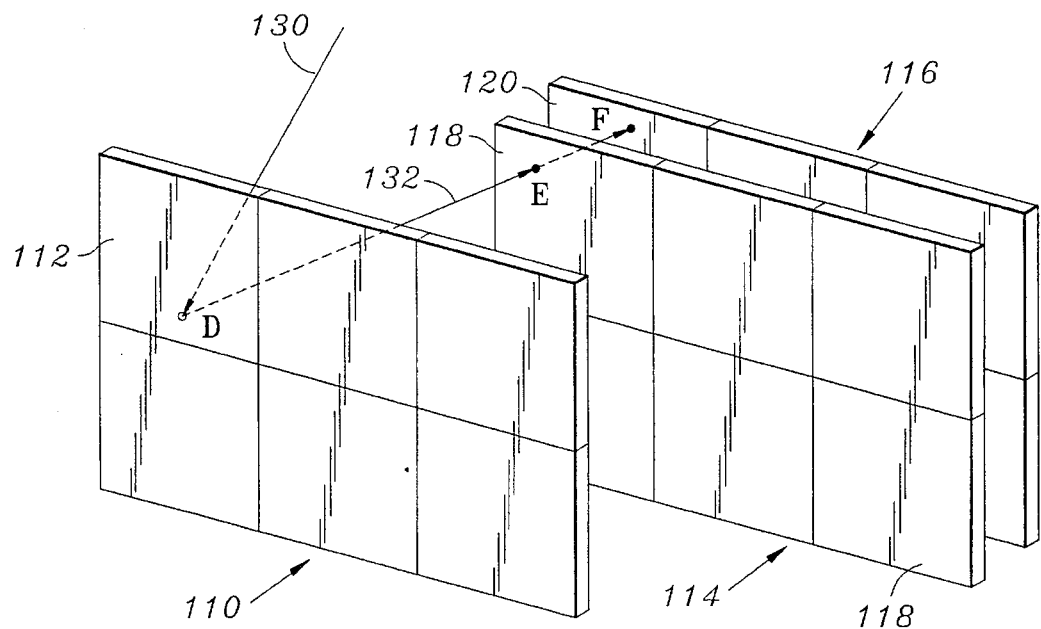
FIG. 2 is a perspective view of a second embodiment of the present invention wherein an array of reflectors focus light through optical elements, e.g., spectral or polarizing filters, upon dedicated sections of the focal plane array.

The multi-image detector assembly of the present invention is illustrated in FIGS. 1 and 2 which depict two presently preferred embodiments of the invention. FIG. 1 depicts a first embodiment wherein an array of lenses, i.e., either diffracting lenses or refracting lenses, focus light through optical elements, e.g., spectral or polarizing filters, upon dedicated sections of a focal plane array. FIG. 2 illustrates a second embodiment of the present invention wherein an array of reflectors focus light through optical elements, e.g., spectral or polarizing filter, upon dedicated sections of a focal plane array.

Referring now to FIG. 1, in a first embodiment of the present invention a plurality of focusing members comprise an array 10 of individual lenses 12. Each lens 12 may be either a diffracting lens or a refracting lens and is preferably formed upon a common or single sheet of transparent material so as to preserve the spatial relationship and alignment among the separate images to a high degree of precision. Alternative, the individual lenses 12 are formed within separate members which are commonly mounted to achieve a desired alignment. Those skilled in the art will recognize that various techniques for forming the lenses 12 are suitable. The manufacturing and replication processes preferably include adjustments from one lens to the next for spectral region differences and diffractive and transmissive properties. The diffractive characteristics of each lens is adjusted to position its image upon the proper part of a focal plane, allowing for differences in size between the lens array and the focal plane array. An array of optical elements 14, such as filters 18 is preferably disposed intermediate the focusing members 10 and a focal plane array 16 of optical detectors.

The optical elements 18 preferably comprise either spectral filters or polarizing filters. Those skilled in the art will recognize that various other types of optical elements for modifying the optical signal prior to its impinging upon the focal plane array 16 may likewise be desirable.

Thus, each lens 12 of the array of focusing members forms an image upon a dedicated section 20 of the focal plane array. As such, image detection occurs continuously and simultaneously upon the plurality of image detector sections 20 such that a correlated set of images is provided by the single focal plane array 16.

Having thus described the structure of the first embodiment of the multi-image detector assembly of the present invention, it may be beneficial to describe the operation thereof. An incoming light ray 30 from an image scene is transmitted through an individual lens 12 at point A thereof. The diffracted or refracted ray 32 is focused such that it passes through an individual optical element 18 at point B and then impinges upon detectors formed within focal plane array section 20 at point C. This process occurs simultaneously for each dedicated set of lenses 12, optical elements 18, and corresponding focal plane array sections 20 so as to provide substantially identical scenes at each individual focal plane section 20.

In a second embodiment of the multi-image detector assembly of the present invention the focusing member 110 comprises an array of individual reflectors 112 configured to focus images upon corresponding dedicated sections 120 of a focal plane array 116 in a manner analogous to that of the first embodiment of the present invention. Disposed intermediate the reflector array 110 and the focal plane array 116, preferably proximate the focal plane array 116, is an optical element array 114 comprised of individual optical elements 118, preferably either spectral or polarizing filters, as in the first embodiment of the present invention.

Having thus described the structure of the second embodiment of the multi-image detector assembly of the present invention, it may be beneficial to describe the operation thereof. An incoming ray 130 of light from the source scene strikes an individual reflector 112 of the reflector array 110 at point D and is focused and reflected toward the focal plane array 116. Reflected ray 132 passes through an individual filter element 118 at point E and impinges upon focal plane array section 120 of focal plane array 116 at point F. As in the first embodiment of the present invention, this process occurs simultaneously at each set of corresponding reflectors 112, optical elements 118, and corresponding focal plane sections 20 so as to provide imaging of a substantially identical scene upon each focal plane section 20.

Thus, a low cost practical system for continuously determining the spectral and/or polarization variations within a moderate-resolution spatial image is provided.

The multi-image detector assembly of the present invention finds particular application in the field of infrared imaging wherein the various spectral components of the infrared image, as well as the various polarizations thereof provide significant information regarding the source and/or components of the imaged scene. For example, an intercontinental ballistic missile in mid-flight would provide different spectral and polarization data from that of the same missile during the early boost phase thereof. A theater-class missile launched from a mobile launcher will exhibit optical, i.e., spectral or polarization, characteristics differing from other battlefield emissions. Those skilled in the art will recognize that various other such application for the present invention likewise exists.

It is understood that the exemplary multi-image detector assemblies described herein and shown in the drawings represent only presently preferred embodiments of the present invention. Indeed, various modifications and additions may be made to such embodiments without departing from the spirit and scope of the invention. For example, various sizes, shapes, and configurations of the focusing members, optical element array, and the array of detector elements are contemplated. Each focusing members need not be substantially identical, but rather may alternatively be of a different focal length so as to provide a different degree of magnification of the imaged scene. Also, those skilled in the art will recognize that various additional optics, i.e. filter, lenses, reflectors, etc. may be utilized in conjunction with the multi-image detector assembly of the present invention so as to optically manipulate the source image, as desired. Additionally, the plurality of optical elements may comprise a plurality of different types of optical elements, e.g. spectral filters and/or polarizing filters. Additionally, the plurality of focusing members may comprise a plurality of different types of focusing members, i.e., diffracting, refracting, and/or reflecting. The present invention may find application in various electromagnetic spectra, including infrared, visible, and ultraviolet. Thus, these and other modifications and additions may be obvious to those skilled in the art and may be implemented to adapt the present invention for use in a variety of different applications.

What is claimed is:

1. A multi-image detector assembly, said detector assembly comprising:
   a) an array of detector elements, said array comprising a plurality of sections thereof;
   b) a plurality of focusing members, each focusing member focusing a substantially identical scene upon a corresponding one of the plurality of sections of said array of detector elements, each focusing member and its corresponding array section defining an optical path; and
   c) a plurality of optical elements, each optical element being disposed within a dedicated one of plurality of said optical paths;
   d) wherein image detection occurs continuously and simultaneously to provide a correlated set of images utilizing a single focal plane.

2. The multi-image detector assembly as recited in claim 1 wherein said plurality of focusing members comprise lenses.

3. The multi-image detector assembly as recited in claim 1 wherein said plurality of focusing members are formed upon a single sheet of transparent material.

4. The multi-image detector assembly as recited in claim 1 wherein said plurality of focusing members are formed upon separate transparent members, each transparent member being oriented so as to maintain a desired spatial relationship and alignment thereof.

5. The multi-image detector assembly as recited in claim 1 wherein said plurality of focusing members comprise diffractive lenses.

6. The multi-image detector assembly as recited in claim 1 wherein said plurality of focusing members comprise refractive lenses.

7. The multi-image detector assembly as recited in claim 1 wherein said plurality of focusing members comprise reflectors.

8. The multi-image detector assembly as recited in claim 1 wherein said plurality of focusing members forms the initial aperture thereof.

9. The multi-image detector assembly as recited in claim 1 wherein said optical elements comprise coatings formed upon said plurality of focusing members.

10. The multi-image detector assembly as recited in claim 1 wherein said optical elements are formed proximate said array of detector elements.

11. The multi-image detector assembly as recited in claim 1 wherein said optical elements comprise at least one of spectral filters and polarizing filters.

12. The multi-image detector assembly as recited in claim 1 wherein said array of detector elements comprises an array of infrared detector elements.

13. The multi-image detector as recited in claim 1 wherein said plurality of optical elements comprises a plurality of different types of optical elements.

14. The multi-image detector as recited in claim 1 wherein said plurality of focusing members comprises a plurality of different types of focusing members.

15. A method for continuously and simultaneously providing a correlated set of images representative of a common scene, said method comprising the steps of:
   a) focusing the scene simultaneously upon a plurality of sections of a common array of detector elements to define a plurality of optical paths; and
   b) separately optically modifying the scene along each optical path focused upon a plurality of the sections of the array of detector elements;
   c) wherein a plurality of correlated scenes are simultaneously formed upon a common focal plane.

16. The method as recited in claim 15 wherein the step of focusing the scene comprises diffractively focusing the scene.

17. The method as recited in claim 15 wherein the step of focusing the scene comprises refractively focusing the scene.

18. The method as recited in claim 15 wherein the step of focusing the scene comprises reflectively focusing the scene.

19. The method as recited in claim 15 wherein the step of optically modifying the scene focused upon at least one section of the array of detector elements comprises at least one of spectral filtering and polarization filtering.

* * * * *